United States Patent
Hsu et al.

(10) Patent No.: US 10,522,755 B2
(45) Date of Patent: Dec. 31, 2019

(54) RESISTIVE MEMORY AND METHOD OF FABRICATING THE SAME

(71) Applicant: Winbond Electronics Corp., Taichung (TW)

(72) Inventors: Po-Yen Hsu, Taichung (TW); Ting-Ying Shen, Taichung (TW); Chia-Hua Ho, Taichung (TW); Chih-Cheng Fu, Taichung (TW); Frederick Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 354 days.

(21) Appl. No.: 15/064,603

(22) Filed: Mar. 9, 2016

(65) Prior Publication Data
US 2017/0125673 A1    May 4, 2017

(30) Foreign Application Priority Data
Oct. 29, 2015  (CN) .......................... 2015 1 0723998

(51) Int. Cl.
H01L 45/00 (2006.01)

(52) U.S. Cl.
CPC .......... *H01L 45/146* (2013.01); *H01L 45/124* (2013.01); *H01L 45/1253* (2013.01); *H01L 45/1683* (2013.01)

(58) Field of Classification Search
CPC ............................. H01L 45/124; H01L 45/146
See application file for complete search history.

(56) References Cited

U.S. PATENT DOCUMENTS

| 8,169,053 | B2 * | 5/2012 | Kim ................... H01L 45/1675 257/314 |
| 8,456,891 | B2 * | 6/2013 | Baek ....................... H01L 45/08 257/2 |
| 9,246,094 | B2 * | 1/2016 | Wang ..................... H01L 45/08 |
| 2006/0054950 | A1 * | 3/2006 | Baek .................... H01L 27/112 257/295 |

(Continued)

FOREIGN PATENT DOCUMENTS

| JP | 2014165345 | 9/2014 |
| WO | 2011064967 | 4/2013 |

(Continued)

OTHER PUBLICATIONS

J. Robertson, "High dielectric constant oxides," Eur. Phys. J. Appl. Phys. 28, 265-291 (2004).*

(Continued)

*Primary Examiner* — Cuong Q Nguyen
*Assistant Examiner* — Shih Tsun A Chou
(74) *Attorney, Agent, or Firm* — JCIPRNET

(57) ABSTRACT

Provided are a resistive memory and a method of fabricating the resistive memory. The resistive memory includes a first electrode, a second electrode, a variable resistance layer, an oxygen exchange layer, and a protection layer. The first electrode and the second electrode are arranged opposite to each other. The variable resistance layer is arranged between the first electrode and the second electrode. The oxygen exchange layer is arranged between the variable resistance layer and the second electrode. The protection layer is arranged at least on sidewalls of the oxygen exchange layer.

9 Claims, 5 Drawing Sheets

(56) References Cited

U.S. PATENT DOCUMENTS

| | | | | |
|---|---|---|---|---|
| 2006/0175599 A1* | 8/2006 | Happ | ................ | G11C 13/0004 257/4 |
| 2009/0184396 A1* | 7/2009 | Kim | .................... | H01L 45/1675 257/536 |
| 2009/0230556 A1* | 9/2009 | Mikawa | ................ | H01L 27/101 257/758 |
| 2010/0187493 A1* | 7/2010 | Takahashi | ........... | G11C 11/5614 257/4 |
| 2011/0291066 A1* | 12/2011 | Baek | ....................... | H01L 45/08 257/4 |
| 2012/0091419 A1* | 4/2012 | Chen | ....................... | H01L 45/08 257/4 |
| 2012/0280199 A1* | 11/2012 | Takagi | ................. | H01L 27/101 257/3 |
| 2012/0292588 A1 | 11/2012 | Fujii et al. | | |
| 2013/0062587 A1* | 3/2013 | Lee | ........................ | H01L 45/08 257/4 |
| 2013/0175494 A1* | 7/2013 | Collins | ................. | H01L 45/085 257/4 |
| 2014/0024197 A1 | 1/2014 | Kawashima et al. | | |
| 2014/0197368 A1 | 7/2014 | Yoneda et al. | | |
| 2016/0365512 A1* | 12/2016 | Sung | ..................... | H01L 45/146 |

FOREIGN PATENT DOCUMENTS

| | | |
|---|---|---|
| WO | 2012081248 | 5/2014 |
| WO | 2013038647 | 3/2015 |
| WO | 2013108593 | 5/2015 |

OTHER PUBLICATIONS

"Search Report of Europe Counterpart Application", dated Mar. 20, 2017, p. 1-p. 6, in which the listed references were cited.

"Office Action of Japan Counterpart Application," dated Aug. 1, 2017, p. 1-p. 5, in which the listed references were cited.

\* cited by examiner

RESISTIVE MEMORY AND METHOD OF FABRICATING THE SAME

CROSS-REFERENCE TO RELATED APPLICATION

This application claims the priority benefit of China application serial no. 201510723998.2, filed on Oct. 29, 2015. The entirety of the above-mentioned patent application is hereby incorporated by reference herein and made a part of this specification.

BACKGROUND OF THE INVENTION

Field of the Invention

The invention relates to a memory and a method of fabricating the same; more particularly, the invention relates to a resistive memory and a method of fabricating the same.

Description of Related Art

In recent years, resistive memories including resistive random access memories (RRAM) have been developed rapidly, have drawn most attention, and may be the most popular memories in the next-generation memory market. Due to the potential advantages of low power consumption, fast operation speed, high density, and compatibility with complementary metal oxide semiconductor (CMOS) manufacturing technologies, the resistive memories can act as the next-generation non-volatile memory devices.

The existing resistive memory often includes an upper electrode and a lower electrode which are arranged opposite to each other and also includes a dielectric layer located between the upper electrode and the lower electrode. Prior to operations of the existing resistive memory, a forming process need be performed, i.e., a relatively high positive bias is applied to the resistive memory, such that oxygen vacancy or oxygen ion is generated in the dielectric layer, and a conductive filament is then formed. In a resetting process, a negative bias is applied to the resistive memory, and accordingly the conductive filament is broken off. At this time, the oxygen vacancy adjacent to the upper electrode is re-filled (or oxygen ion departs from a path of electric current); as a result, the conductive filament is broken off at a location close to the upper electrode. By contrast, in a setting process, a positive bias is applied to the resistive memory, such that the oxygen vacancy or the oxygen ion is generated once more in the dielectric layer, and a new conductive filament is formed again.

In the conventional RRAM manufacturing process, a memory cell is defined by an etching process, and it is likely to form dangling bonds on sidewalls of the memory cell in a plasma treatment step or a wet cleansing step of the etching process. During the resetting process, the dangling bonds are combined with the oxygen vacancy or the oxygen ion, thus resulting in reset failure. Hence, how to provide a resistive memory and a method of fabricating the same to protect the sidewalls of the memory cell, prevent the reset failure, and further enhance high-temperature data retention (HTDR) is one of the crucial research topics in the pertinent field.

SUMMARY

The invention provides a resistive memory, and a method of fabricating the same is also provided to protect sidewalls of memory cells, prevent reset failure, and further enhance HTDR.

In an embodiment of the invention, a resistive memory that includes a first electrode, a second electrode, a variable resistance layer, an oxygen exchange layer, and a protection layer is provided. The first electrode and the second electrode are arranged opposite to each other. The variable resistance layer is arranged between the first electrode and the second electrode. The oxygen exchange layer is arranged between the variable resistance layer and the second electrode. The protection layer is disposed at least on sidewalls of the oxygen exchange layer.

In an embodiment of the invention, a method of fabricating a resistive memory includes following steps. A first electrode and a second electrode opposite to each other are formed. A variable resistance layer is formed between the first electrode and the second electrode. An oxygen exchange layer is formed between the variable resistance layer and the second electrode. A protection layer at least covering sidewalls of the oxygen exchange layer is formed.

In view of the above, the oxygen exchange layer fills an opening of the first dielectric layer, so as to prevent the damage to the sidewalls of the oxygen exchange layer due to the plasma treatment step or the wet cleansing step in the etching process. Thus, flatness of the sidewall of the oxygen exchange layer can be further enhanced. Besides, the protection layer having a high dielectric constant covers the sidewalls of the oxygen exchange layer, and the protection layer not only protects the sidewalls of the oxygen exchange layer but also provides oxygen to the oxygen exchange layer and restrains the filament from moving away from the center of the oxygen exchange layer, so as to increase the current density and further enhance HTDR.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
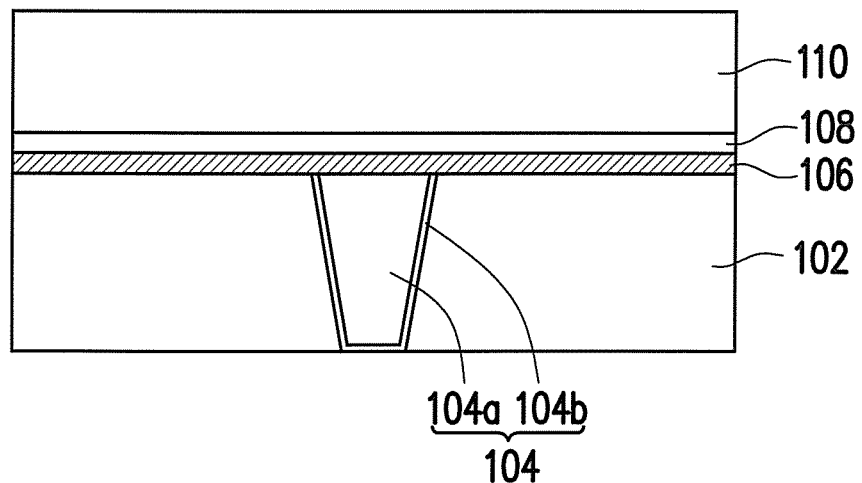
FIG. 1A to FIG. 1I are schematic cross-sectional diagrams illustrating a process of fabricating a resistive memory according to an embodiment of the invention.

The invention will now be described with reference to the accompanying drawings, in which exemplary embodiments of the invention are shown. Note that the invention can be accomplished in many different ways and should not be limited to the embodiments set forth herein. The thickness of layers and regions shown in the drawings may be enlarged for clear illustration. Identical or similar reference numbers represent the identical or similar devices, and thus these identical or similar devices will not be elaborated in each paragraph below.

FIG. 1A to FIG. 1I are schematic cross-sectional diagrams illustrating a process of fabricating a resistive memory according to an embodiment of the invention.

With reference to FIG. 1A, a via 104 is formed in a dielectric layer 102. Specifically, the via 104 may be formed by firstly forming a via opening (not shown) in the dielectric layer 102, for instance. A barrier layer 104b is conformally formed in the via opening. The via opening is filled with a plug 104a, such that the barrier layer 104b is arranged between the dielectric layer 102 and the plug 104a. According to an embodiment, the plug 104a and the barrier layer 104b may be considered as the via 104. In FIG. 1A, only one via is depicted, which should however not be construed as a limitation to the invention; in other embodiments, the number of vias may be adjusted according to actual demands. According to an embodiment, the plug 104a includes a metal material that may be tungsten, for instance, and the plug 104a may be formed through chemical vapor deposition (CVD), for instance. The barrier layer 104b is, for instance, tungsten nitride, titanium nitride, tantalum nitride, or a combination thereof, and a method of forming the barrier layer 104b may be CVD, for instance. The dielectric layer 102 is, for instance, silicon oxide, silicon nitride, or a combination thereof, and the dielectric layer 102 may be formed through CVD, for instance.

A first electrode 106, a variable resistance layer 108, and a first dielectric layer 110 are sequentially formed on the dielectric layer 102. The first electrode 106 includes titanium nitride (TiN), platinum (Pt), iridium (Ir), ruthenium (Ru), titanium (Ti), tungsten (W), tantalum (Ta), aluminum (Al), zirconium (Zr), hafnium (Hf), nickel (Ni), copper (Cu), cobalt (Co), iron (Fe), gadolinium (Y), manganese (Mo), or a combination thereof, and the first electrode 106 may be formed through physical vapor deposition (PVD) or CVD, for instance. The variable resistance layer 108 includes hafnium oxide (e.g., HfO or HfO2), lanthanum oxide, gadolinium oxide, yttrium oxide, zirconium oxide, titanium oxide, tantalum oxide, nickel oxide, tungsten oxide, copper oxide, cobalt oxide, iron oxide, aluminum oxide, or a combination thereof, and the variable resistance layer 108 may be formed through CVD, for instance. The first dielectric layer 110 is, for instance, silicon oxide, silicon nitride, or a combination thereof, and the first dielectric layer 110 may be formed through atomic layer deposition (ALD) or CVD, for instance.

Figure 1B:
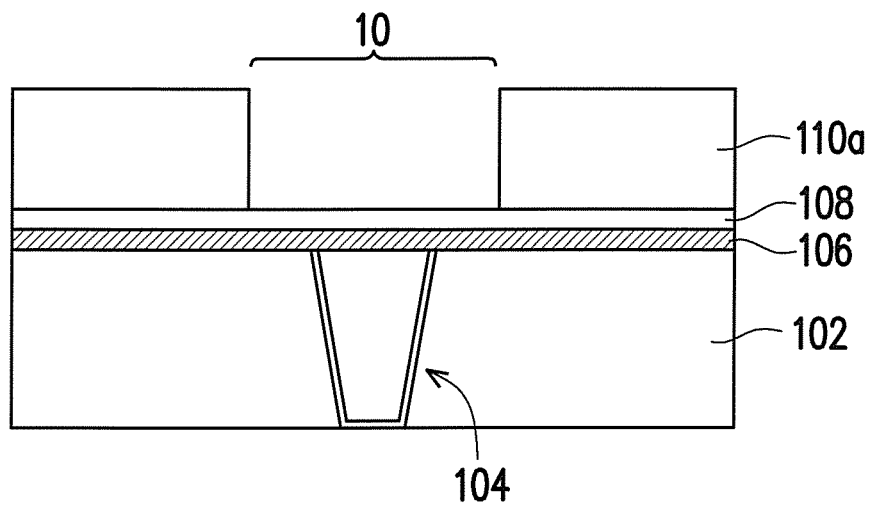

With reference to FIG. 1B, an opening 10 is framed in a first dielectric layer 110a, and the opening 10 exposes a top surface of the variable resistance layer 108. The opening 10 corresponds to the via 104 and may serve to define regions where a memory cell 120 is subsequently formed (as shown in FIG. 1I).

Figure 1C:
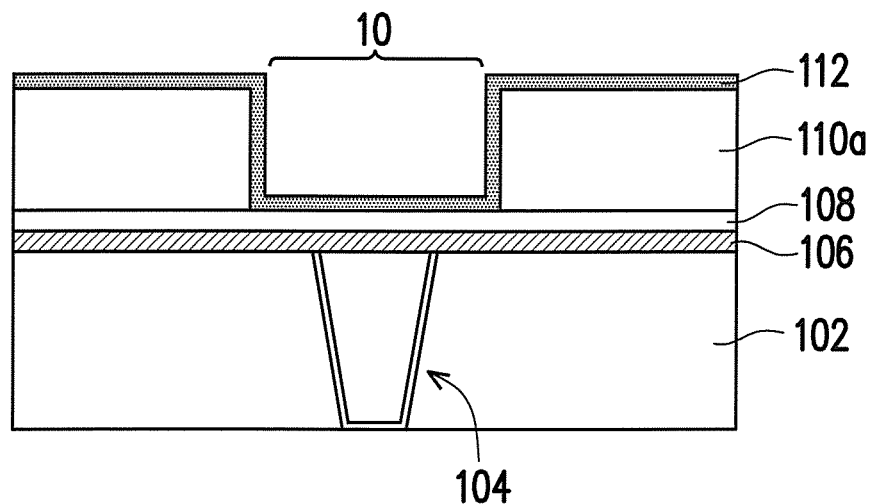

With reference to FIG. 1C, a protection layer 112 is conformally formed on the dielectric layer 102. The protection layer 112 covers a top surface of the first dielectric layer 110a and a surface of the opening 10. In an embodiment of the invention, the protection layer 112 includes a high dielectric constant material having a higher dielectric constant than $SiO_2$. The high dielectric constant material may include metal oxide, and the metal oxide may be hafnium oxide, lanthanum oxide, gadolinium oxide, yttrium oxide, zirconium oxide, titanium oxide, tantalum oxide, nickel oxide, tungsten oxide, copper oxide, cobalt oxide, iron oxide, aluminum oxide, or a combination thereof, for instance. A method of forming the protection layer 112 may be ALD or CVD, for instance, and a thickness of the protection layer 112 may be within a range from 0.3 nm to 2 nm.

Figure 1D:
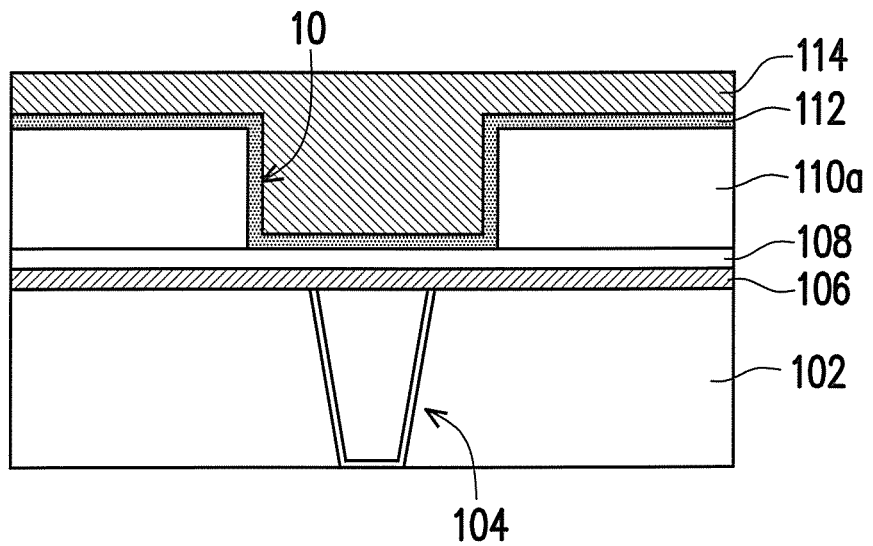

With reference to FIG. 1D, an oxygen exchange layer 114 is formed on the protection layer 112. The opening 10 is filled with the oxygen exchange layer 114, and the oxygen exchange layer 114 covers a surface of the protection layer 112, such that the protection layer 112 is located between the oxygen exchange layer 114 and the first dielectric layer 110a. The oxygen exchange layer 114 includes titanium (Ti), tantalum (Ta), hafnium (Hf), zirconium (Zr), platinum (Pt), aluminum (Al), or a combination thereof, and the oxygen exchange layer 114 may be formed through PVD or CVD, for instance. Note that the oxygen exchange layer 114 fills the opening 10, so as to prevent the damage to the sidewalls of the oxygen exchange layer due to a plasma treatment step or a wet cleansing step in the etching process. Thus, flatness of the sidewall of the oxygen exchange layer 114 can be enhanced. Moreover, dangling bonds are not generated. Hence, as provided herein, reset failure can be prevented, and HTDR can be improved.

Figure 1E:
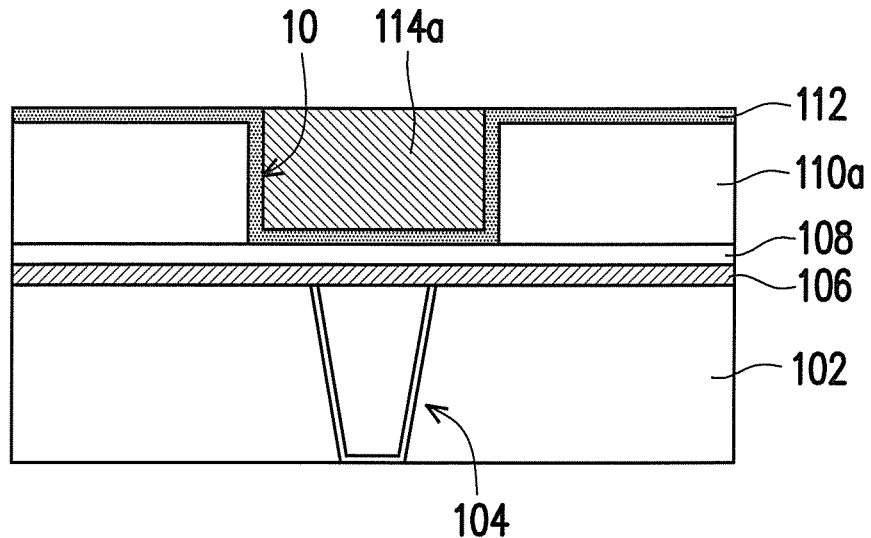

With reference to FIG. 1D and FIG. 1E, a planarization step is performed to remove a portion of the oxygen exchange layer 114 to expose a top surface of the protection layer 112. According to an embodiment of the invention, the planarization step is, for instance, an etch back step or a chemical mechanical polishing (CMP) step.

Figure 1F:
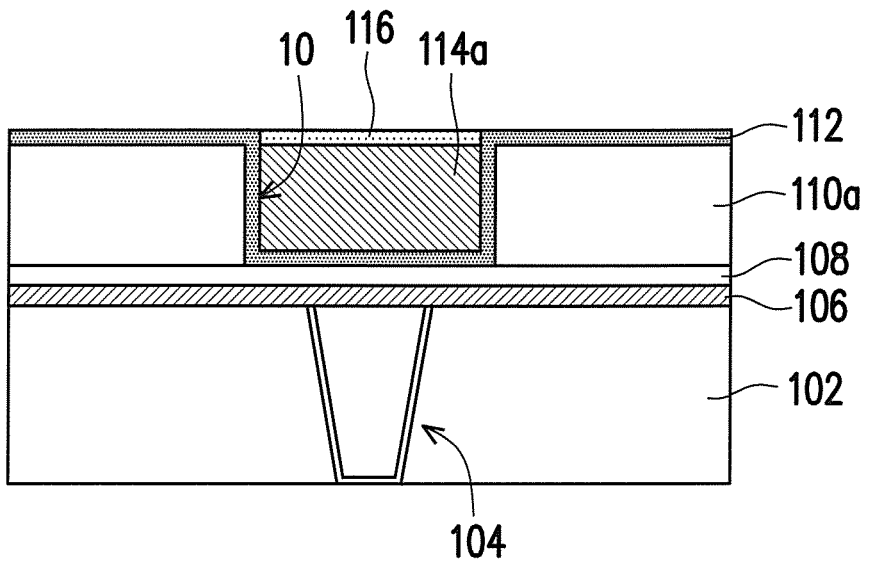

With reference to FIG. 1F, a barrier layer 116 is formed on an oxygen exchange layer 114a. In an embodiment, the barrier layer 116 includes metal oxide. In another embodiment, the barrier layer 116 may include titanium oxynitride, aluminum oxide, hafnium oxide, zirconium oxide, or a combination thereof. If the barrier layer 116 is made of titanium oxynitride, for instance, a nitridation step may be performed, such that titanium oxynitride is merely formed on a top surface of the oxygen exchange layer 114a. Alternatively, if the barrier layer 116 is made of aluminum oxide, for instance, a deposition step may be performed, such that aluminum oxide not only covers the top surface of the oxygen exchange layer 114a but also covers the top surface of the protection layer 112 (not shown). During the setting or resetting process, it should be mentioned that the barrier layer 116 is able to prevent non-uniformity of the filament that results from large current passing through the oxygen exchange layer 114a.

Figure 1G:
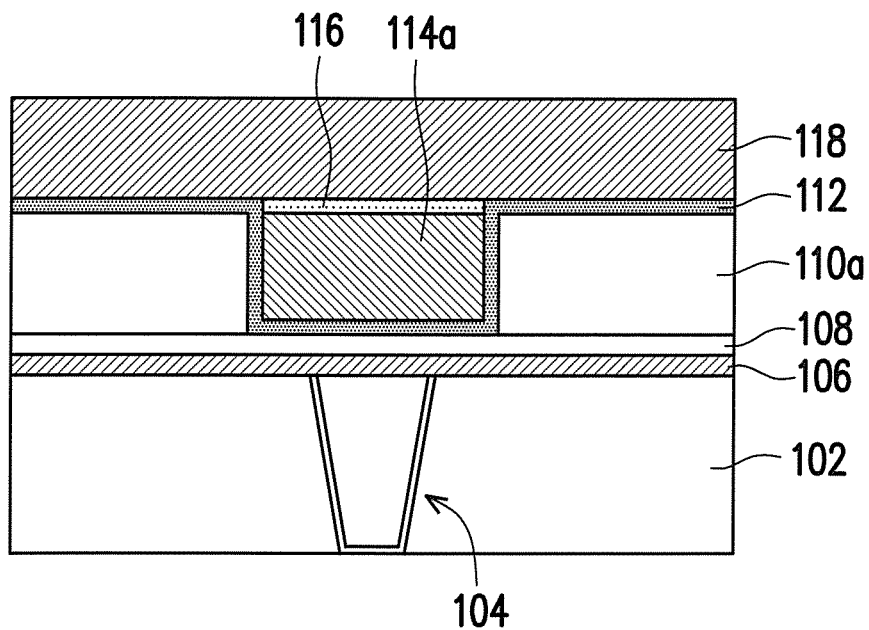

With reference to FIG. 1G, a second electrode 118 is formed on the protection layer 112 and the barrier layer 116. The second electrode 118 may include TiN, Pt, Ir, Ru, Ti, W, Ta, Al, Zr, Hf, Ni, Cu, Co, Fe, Y, Mo, or a combination thereof, and the first electrode 106 may be formed through PVD or CVD, for instance.

Figure 1H:
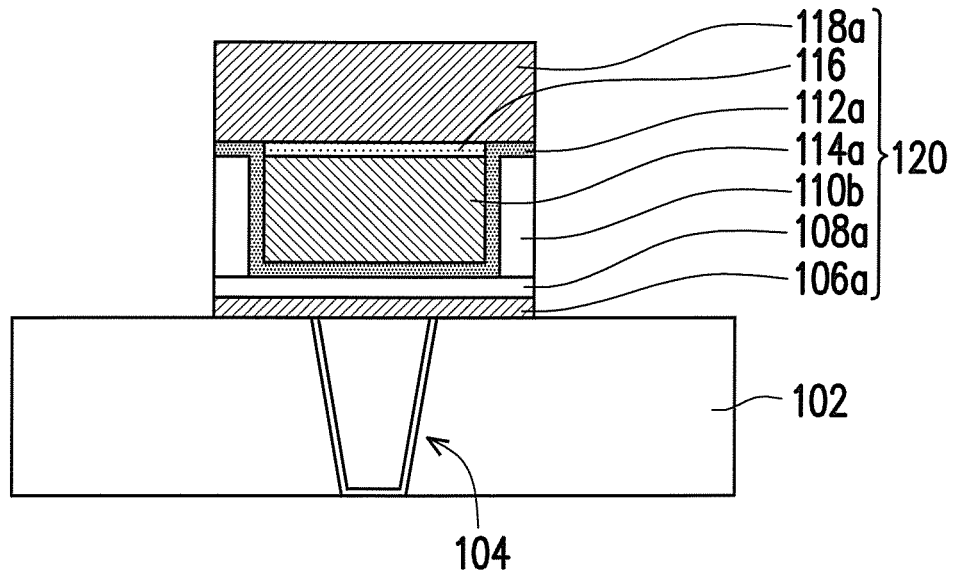
Figure 1I:
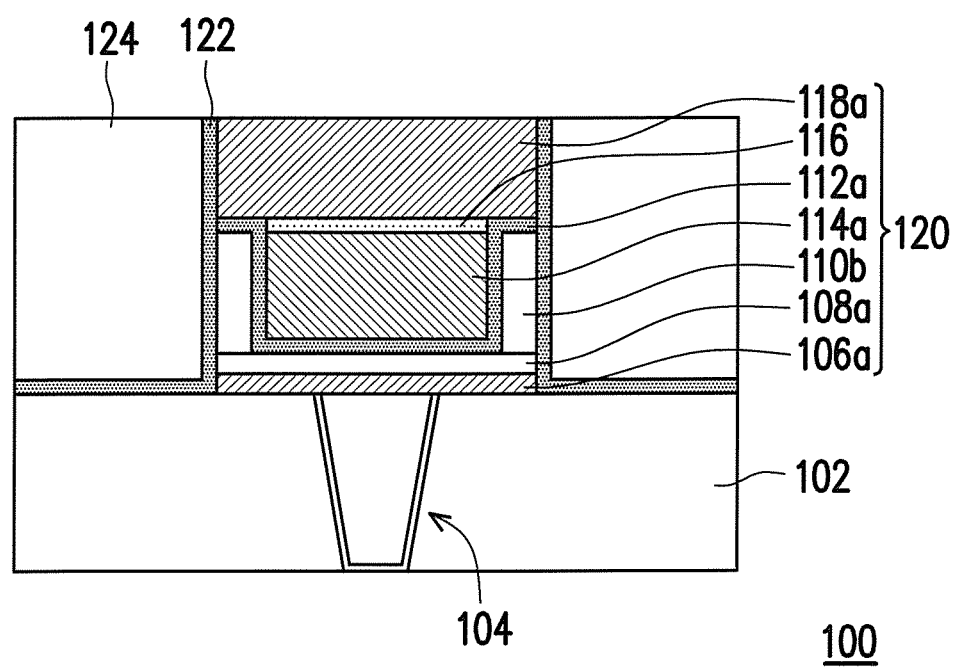

With reference to FIG. 1G and FIG. 1H, a patterning process is performed to remove a portion of the second electrode 118, a portion of the protection layer 112, a portion of the first dielectric layer 110a, a portion of the variable resistance layer 108, and a portion of the first electrode 106, and thereby a top surface of the dielectric layer 102 is exposed, and the memory cell 120 is further formed.

With reference to FIG. 1I, a metal oxide layer 122 is conformally formed on a top surface and sidewalls of the memory cell 120 and on the top surface of the dielectric layer 102 (not shown). A dielectric layer 124 is formed on the metal oxide layer 122 (not shown) in a blanket manner. A planarization step is then performed with use of the second electrode 118a as a stop layer, so as to remove a portion of the metal oxide layer 122 and a portion of the dielectric layer 124 as well as expose a top surface of the second electrode 118a. In an embodiment of the invention, the metal oxide layer 122 may include hafnium oxide, lanthanum oxide, gadolinium oxide, yttrium oxide, zirconium oxide, titanium oxide, tantalum oxide, nickel oxide, tungsten oxide, copper oxide, cobalt oxide, iron oxide, aluminum oxide, or a combination thereof, and the metal oxide layer 122 may be formed through ALD or CVD, for instance. The dielectric layer 124 is, for instance, silicon oxide, silicon nitride, or a combination thereof, and the dielectric layer 124 may be formed through CVD, for instance.

With reference to FIG. 1I, a resistive memory 100 that includes the dielectric layer 102, the via 104, the metal oxide layer 122, the dielectric layer 124, and the memory cell 120 is provided in the present embodiment. The via 104 is arranged in the dielectric layer 102. The memory cell 120 is arranged on the via 104. The dielectric layer 124 is arranged next to the memory cell 120. The metal oxide layer 122 is arranged between the dielectric layer 124 and the memory cell 120 and between the dielectric layer 124 and the dielectric layer 102.

The memory cell 120 includes the first electrode 106a, the second electrode 118a, the variable resistance layer 108a, the first dielectric layer 110b, the oxygen exchange layer 114a, the barrier layer 116, and the protection layer 112a. The first electrode 106a and the second electrode 118a are arranged opposite to each other. The variable resistance layer 108a is arranged between the first electrode 106a and the second electrode 118a. The oxygen exchange layer 114a is arranged between the variable resistance layer 108a and the second electrode 118a. The first dielectric layer 110b is arranged next to the oxygen exchange layer 114a and on the variable resistance layer 108a. The barrier layer 116 is arranged between the oxygen exchange layer 114a and the second electrode 118a. In the present embodiment, the protection layer 112a not only resides on the sidewalls of the oxygen exchange layer 114a but also extends to a space between the oxygen exchange layer 114a and the variable resistance layer 108a and extends to the top surface of the first dielectric layer 110b. From another perspective, the protection layer 112a is also arranged between the first dielectric layer 110b and the oxygen exchange layer 114a.

Note that the oxygen exchange layer 114a fills the opening 10, so as to prevent the damage to the sidewalls of the oxygen exchange layer 114a due to a plasma treatment step or a wet cleansing step in the etching process. Thus, flatness of the sidewall of the oxygen exchange layer 114a can be enhanced. Moreover, dangling bonds are not generated on the sidewalls of the oxygen exchange layer 114a, and reset failure is less likely to occur. In another aspect, the protection layer 112a provided herein may serve to provide oxygen to the oxygen exchange layer 114a. That is, during the setting process, the density of the oxygen vacancy or oxygen ion can be easily controlled, such that the oxygen vacancy or oxygen ion can better stay at the center of the oxygen exchange layer 114a, i.e., the filament is restrained from moving away from the center of the oxygen exchange layer 114a, so as to increase the current density and further enhance HTDR.

In addition, the first dielectric layer 110b provided in the present embodiment is also arranged adjacent to the oxygen exchange layer 114a, such that electric field can be concentrated at the center of the oxygen exchange layer 114a; as such, the filament is able to stay at the center of the oxygen exchange layer 114a, and HTDR can be further improved.

To sum up, the oxygen exchange layer fills the opening of the first dielectric layer, so as to prevent the damage to the sidewalls of the oxygen exchange layer due to the plasma treatment step or the wet cleansing step in the etching process. Thus, flatness of the sidewall of the oxygen exchange layer can be improved. Besides, the protection layer having a high dielectric constant covers the sidewalls of the oxygen exchange layer, and the protection layer not only protects the sidewalls of the oxygen exchange layer but also provides oxygen to the oxygen exchange layer and restrains the filament from moving away from the center of the oxygen exchange layer, so as to increase the current density and further enhance HTDR.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A resistive memory comprising:
   a first electrode and a second electrode arranged opposite to each other;
   a variable resistance layer arranged between the first electrode and the second electrode;
   a first dielectric layer sandwiched between the variable resistance layer and the second electrode and having an opening, wherein a portion of a top surface of the variable resistance layer is exposed by the opening of the first dielectric layer, and the first dielectric layer is in physical contact with another portion of the top surface of the variable resistance layer;
   a protection layer arranged conformally on a bottom and sidewalls of the opening and extending to a top surface of the first dielectric layer, such that the protection layer is sandwiched between the top surface of the first dielectric layer and a bottom surface of the second electrode; and
   an oxygen exchange layer filled in the opening, such that the protection layer is arranged on sidewalls of the oxygen exchange layer and sandwiched between the oxygen exchange layer and the variable resistance layer.

2. The resistive memory as recited in claim 1, wherein the protection layer comprises a high dielectric constant material having a higher dielectric constant than $SiO_2$.

3. The resistive memory as recited in claim 2, wherein the high dielectric constant material comprises metal oxide, and the metal oxide comprises hafnium oxide, lanthanum oxide, gadolinium oxide, yttrium oxide, zirconium oxide, titanium oxide, tantalum oxide, nickel oxide, tungsten oxide, copper oxide, cobalt oxide, iron oxide, or a combination thereof.

4. The resistive memory as recited in claim 1, wherein the first dielectric layer comprises silicon oxide, silicon nitride, or a combination thereof.

5. The resistive memory as recited in claim 1, further comprising a barrier layer arranged between the oxygen exchange layer and the second electrode.

6. The resistive memory as recited in claim 5, wherein the barrier layer comprises metal oxide.

7. The resistive memory as recited in claim 5, wherein the barrier layer comprises titanium oxynitride, aluminum oxide, hafnium oxide, zirconium oxide, or a combination thereof.

8. The resistive memory as recited in claim 1, wherein the variable resistance layer comprises hafnium oxide, lanthanum oxide, gadolinium oxide, yttrium oxide, zirconium oxide, titanium oxide, tantalum oxide, nickel oxide, tungsten oxide, copper oxide, cobalt oxide, iron oxide, or a combination thereof.

9. The resistive memory as recited in claim 1, wherein a width of the oxygen exchange layer is less than a width of the second electrode.

* * * * *